(12) United States Patent
Nojiri

(10) Patent No.: US 8,766,226 B2
(45) Date of Patent: Jul. 1, 2014

(54) NON-VOLATILE SEMICONDUCTOR STORAGE DEVICE AND MANUFACTURING METHOD OF NON-VOLATILE SEMICONDUCTOR STORAGE DEVICE

(75) Inventor: Yasuhiro Nojiri, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 229 days.

(21) Appl. No.: 13/334,848

(22) Filed: Dec. 22, 2011

(65) Prior Publication Data

US 2012/0235109 A1 Sep. 20, 2012

(30) Foreign Application Priority Data

Mar. 18, 2011 (JP) ................................. 2011-060147

(51) Int. Cl.
*H01L 47/00* (2006.01)
*H01L 29/02* (2006.01)

(52) U.S. Cl.
USPC .............. 257/2; 257/3; 257/4; 257/5; 257/95; 257/97; 257/E21.004; 257/E21.52; 257/E45.002; 365/148; 365/163; 438/95; 438/382

(58) Field of Classification Search
USPC ........ 257/2, 3, 4, 5, 95, 97, E21.004, E21.52; 365/148, 163; 438/95, 382
See application file for complete search history.

(56) References Cited

U.S. PATENT DOCUMENTS

| | | | |
|---|---|---|---|
| 7,335,906 B2 * | 2/2008 | Toda ................................. | 257/2 |
| 7,704,788 B2 * | 4/2010 | Youn et al. ..................... | 438/102 |
| 8,044,456 B2 | 10/2011 | Nagashima et al. | |
| 2002/0075719 A1 * | 6/2002 | Johnson et al. ............... | 365/130 |
| 2008/0078984 A1 | 4/2008 | Park et al. | |
| 2008/0099753 A1 * | 5/2008 | Song et al. ....................... | 257/2 |
| 2008/0315359 A1 * | 12/2008 | Happ et al. ..................... | 257/537 |
| 2010/0038614 A1 * | 2/2010 | Hampton ........................ | 257/2 |
| 2010/0038616 A1 | 2/2010 | Nagashima et al. | |
| 2010/0038624 A1 | 2/2010 | Lee et al. | |
| 2010/0200833 A1 | 8/2010 | Sim et al. | |

FOREIGN PATENT DOCUMENTS

| | | |
|---|---|---|
| JP | 2009-71298 | 4/2009 |
| JP | 2010-045205 A | 2/2010 |
| JP | 2010-87259 | 4/2010 |
| WO | WO 2009/122569 A1 | 10/2009 |
| WO | WO 2010/026624 A1 | 3/2010 |

OTHER PUBLICATIONS

Office Action issued Jun. 25, 2013 in Japanese Patent Application No. 2011-060147 (with English language translation).
Office Action issued Sep. 17, 2013 in Japanese Application No. 2011-060147 (With English Translation).

* cited by examiner

*Primary Examiner* — Dao H Nguyen
(74) *Attorney, Agent, or Firm* — Oblon, Spivak, McClelland, Maier & Neustadt, L.L.P.

(57) ABSTRACT

According to one embodiment, a memory cell includes a resistance change layer, an upper electrode layer, a lower electrode layer, a diode layer, a first oxide film, and a second oxide film. The upper electrode layer is arranged above the resistance change layer. The lower electrode layer is arranged below the resistance change layer. The diode layer is arranged above the upper electrode layer or below the lower electrode layer. The first oxide film exists on a side wall of at least one electrode layer of the upper electrode layer or the lower electrode layer. The second oxide film exists on a side wall of the diode layer. The film thickness of the first oxide film is thicker than a film thickness of the second oxide film.

19 Claims, 25 Drawing Sheets

61b

261d1

NON-VOLATILE SEMICONDUCTOR STORAGE DEVICE AND MANUFACTURING METHOD OF NON-VOLATILE SEMICONDUCTOR STORAGE DEVICE

CROSS-REFERENCE TO RELATED APPLICATIONS

This application is based upon and claims the benefit of priority from Japanese Patent Application No. 2011-060147, filed on Mar. 18, 2011; the entire contents of which are incorporated herein by reference.

FIELD

Embodiments described herein relate generally to a non-volatile semiconductor storage device, and a manufacturing method of a non-volatile semiconductor storage device.

BACKGROUND

In recent years, the demand for a compact and large-capacity information recording and reproducing device (storage device) is rapidly expanding. Among them, a NAND type flash memory and a compact HDD (Hard Disk Drive) have achieved the evolution of rapid recording density and have come to form a large market. Under such situation, a couple of ideas of a new memory aiming to greatly exceed the limit of recording density have been proposed. A non-volatile semiconductor memory that uses a resistance changing material having a low resistance state and a high resistance state has been drawing attention.

In such non-volatile semiconductor memory, a voltage pulse is applied to a resistance change film in a memory cell to repeatedly change the low resistance state and the high resistance state, where data is recorded with the two states corresponded to binary data "0" and "1". In this case, enhancement in the properties of the memory cell such as the properties of change (set) from the high resistance state to the low resistance state and the change (reset) from the low resistance state to the high resistance state is anticipated. For instance, operation in which the switching current (Iset/Ireset) of the resistance change film (resistance change layer) is reduced is desired from the standpoint of low power consumption.

DETAILED DESCRIPTION

In general, according to one embodiment, there is provided A non-volatile semiconductor storage device including a first line, a second line, and a memory cell. The second line intersects the first line. The memory cell is arranged at a position where the first line and the second line intersect. The memory cell includes a resistance change layer, an upper electrode layer, a lower electrode layer, a diode layer, a first oxide film, and a second oxide film. The upper electrode layer is arranged above the resistance change layer. The lower electrode layer is arranged below the resistance change layer. The diode layer is arranged above the upper electrode layer or below the lower electrode layer. The first oxide film exists on a side wall of at least one electrode layer of the upper electrode layer or the lower electrode layer. The second oxide film exists on a side wall of the diode layer. The film thickness of the first oxide film is thicker than a film thickness of the second oxide film.

Exemplary embodiments of non-volatile semiconductor storage device and a manufacturing method of the non-volatile semiconductor storage device will be explained below in detail with reference to the accompanying drawings. The present invention is not limited to the following embodiments. In the specification, when referred to being arranged "above" a predetermined layer, it means that it is arranged on the side opposite to the semiconductor substrate with respect to the predetermined layer, whereas when referred to being arranged "below" a predetermined layer, it means that it is arranged on the semiconductor substrate side with respect to the predetermined layer.

(First Embodiment)

Figure 1:
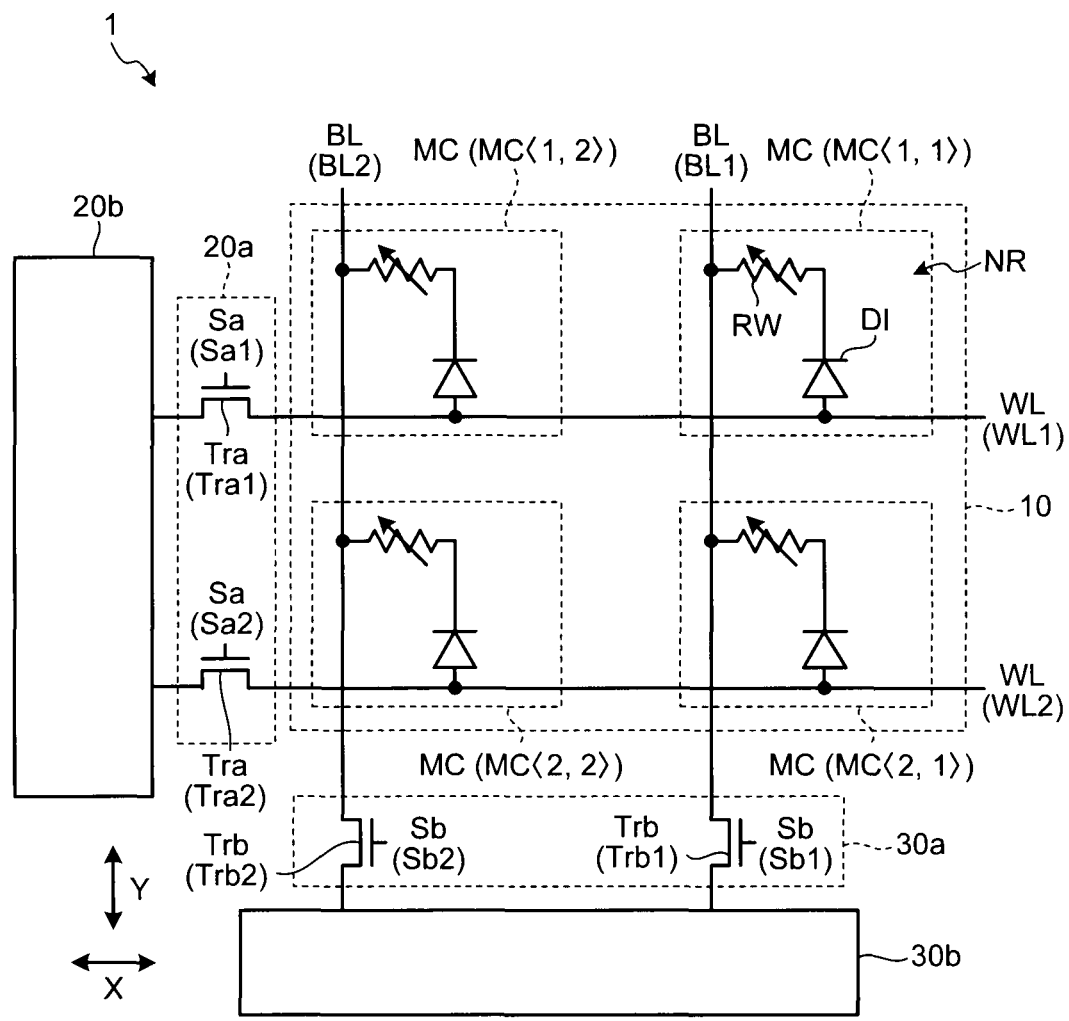
FIG. 1 is a view illustrating a configuration of a non-volatile semiconductor storage device according to a first embodiment.

The configuration of a non-volatile semiconductor storage device 1 according to a first embodiment will be described using FIG. 1. FIG. 1 is a view illustrating a circuit configuration of the non-volatile semiconductor storage device 1 according to the first embodiment.

The non-volatile semiconductor storage device 1 includes a plurality of word lines WL, a plurality of bit lines BL, a memory cell array 10, a word line selection circuit 20a, a word line drive circuit 20b, a bit line selection circuit 30a, and a bit line drive circuit 30b.

Each of the plurality of word lines WL (WL1, WL2) extends along an X direction. The plurality of word lines WL are arrayed with a predetermined pitch in a Y direction.

Each of the plurality of bit lines BL (BL1, BL) extends along a Y direction. The plurality of bit lines (plurality of first lines) BL intersect the plurality of word lines (plurality of second lines) WL. The plurality of bit lines BL are arrayed with a predetermined pitch in the X direction.

In the memory cell array 10, a plurality of memory cells MC (MC <1, 1> to MC <2, 2>) are at least arrayed in a matrix form (X direction and Y direction). Each of the plurality of memory cells MC is arranged at a position (cross point) where the bit line BL and the word line WL intersect. In other words, the memory cell array 10 is configured to be a so-called cross point type.

Each memory cell MC includes a diode DI and a resistance change element RW. The diode DI and the resistance change element RW are connected in series in the memory cell MC.

The diode DI is arranged to enable the resistance change element RW connected in series to be selected. In other words, the diode DI is arranged to prevent the sneak current at the time of recording/reading. The diode DI has its anode connected to the word line WL and its cathode connected to the resistance change element RW.

The resistance change element RW is electrically rewritable and stores data in a non-volatile manner based on a resistance value. In other words, the resistance change element RW is applied with a voltage pulse from the word line drive circuit 20b and the word line selection circuit 20a so as to be able to repeatedly change to the low resistance state and the high resistance state. The resistance change element RW stores data with the two states corresponded to the binary data "0" and "1". The resistance change element RW has one end connected to the bit line BL and the other end connected to the diode DI.

Each memory cell MC may have the diode DI connected in reversed polarity, or may have the arrangement of the diode DI and the resistance change element RW interchanged.

The word line selection circuit 20a includes a plurality of selection transistors Tra (Tra1, Tra2). Each selection transistor Tra has one of the source or the drain connected to the word line WL, and the other one of the source or the drain connected to the word line drive circuit 20b. A signal Sa (Sa1, Sa2) is provided to the gate of each selection transistor Tra. In other words, either one of the plurality of signals Sa1, Sa2 is selectively made to an active level, and either one of the plurality of selection transistors Tra1, Tra2 is selectively turned ON, so that either one of the plurality of word lines WL1, WL2 is selectively connected to the word line drive circuit 20b.

The word line drive circuit 20b applies a predetermined voltage pulse to the word line WL connected through the word line selection circuit 20a. The predetermined voltage pulse is a voltage pulse necessary for erasing of data of the memory cell MC, writing of data to the memory cell MC, reading of data from the memory cell MC, and the like.

The bit line selection circuit 30a includes a plurality of selection transistors Trb (Trb1, Trb2). Each selection transistor Trb has one of the source or the drain connected to the bit line BL, and the other one of the source or the drain connected to the bit line drive circuit 30b. A signal Sb (Sb1, Sb2) is provided to the gate of each selection transistor Trb. In other words, either one of the plurality of signals Sb1, Sb2 is selectively made to an active level, and either one of the plurality of selection transistors Trb1, Trb2 is selectively turned ON, so that the bit line BL is selectively connected to the bit line drive circuit 30b.

The bit line drive circuit 30b applies a predetermined voltage pulse to the bit line BL connected through the bit line selection circuit 30a. The predetermined voltage pulse is a voltage pulse necessary for erasing of data of the memory cell MC, writing of data to the memory cell MC, reading of data from the memory cell MC, and the like. Thus, the memory cell MC connected to the bit line BL is accessed, and the operation such as erasing, writing, or reading of data is carried out respect to the memory cell MC. The bit line drive circuit 30b outputs the data read from the memory cell MC through the bit line BL to outside.

Figure 2:
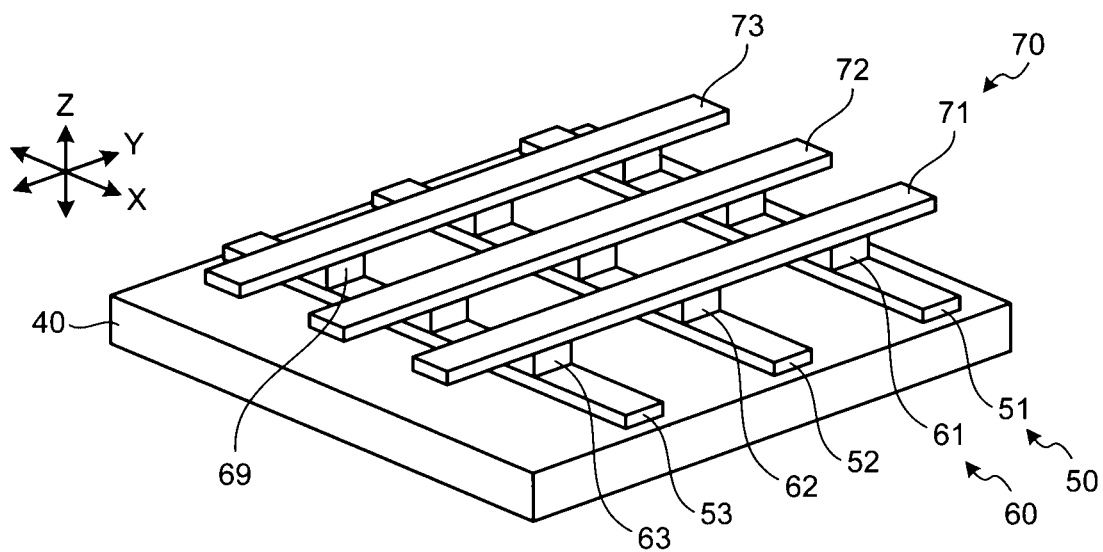
FIG. 2 is a view illustrating the configuration of the non-volatile semiconductor storage device according to the first embodiment.

A schematic layer configuration in the non-volatile semiconductor storage device in the first embodiment will now be described with reference to FIG. 2. FIG. 2 is a view illustrating one example of a schematic layer configuration in the non-volatile semiconductor storage device in the first embodiment.

The non-volatile semiconductor storage device 1 includes a semiconductor substrate 40, a first conductive layer 50, a memory layer 60, and a second conductive layer 70.

The semiconductor substrate 40 is formed of a semiconductor such as silicon.

The first conductive layer 50 is arranged on the upper side of the semiconductor substrate 40. The first conductive layer 50 is formed of a material that has resistance to heat and that has low resistance value, for example, a conductor such as metal. The first conductive layer 50 is formed of, for example, a layer including at least one of tungsten (W), titanium (Ti), tantalum (Ta), and a nitride as a main component, or a stacked structure thereof.

The first conductive layer 50 includes a plurality of line patterns 51 to 53. Each line pattern 51 to 53 functions as a word line WL. The plurality of line patterns 51 to 53 are arrayed with a predetermined pitch in the Y direction. Each line pattern 51 to 53 extends in the X direction.

The memory layer 60 is arranged between the first conductive layer 50 and the second conductive layer 70. The configuration in the memory layer 60 will be described later.

The memory layer 60 includes a plurality of memory cells 61 to 69. Each memory cell 61 to 69 functions as a memory cell MC. The plurality of memory cells 61 to 69 are arrayed in a matrix form in the X direction and the Y direction. Each memory cell 61 to 69 is arranged at a position where the line pattern 51 to 53 and a line pattern 73 to 73, to be described later, intersect. The array of the plurality of memory cells 61 to 69, that is, the memory cell array 10 (see FIG. 1) is configured by a so-called cross point type.

The second conductive layer 70 is arranged above the memory layer 60. The second conductive layer 70 is formed of a material that has resistance to heat and that has low resistance value, for example, a conductor such as metal. The second conductive layer 70 is formed of, for example, a layer including at least one of tungsten (W), titanium (Ti), tantalum (Ta), and a nitride as a main component, or a stacked structure thereof.

The second conductive layer 70 includes a plurality of line patterns 71 to 73. Each line pattern 71 to 73 functions as a bit line BL. The plurality of line patterns 71 to 73 are arrayed with a predetermined pitch in the X direction. Each line pattern 71 to 73 extends in the Y direction.

Figure 3:
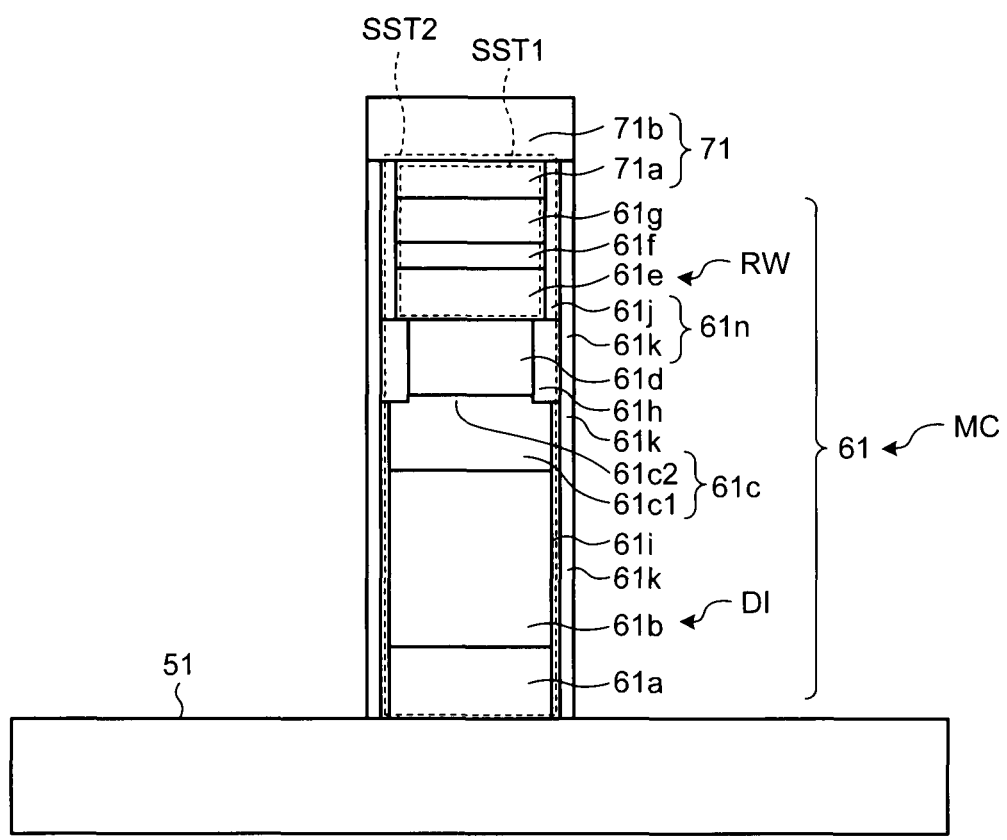
FIG. 3 is a view illustrating the configuration of the non-volatile semiconductor storage device according to the first embodiment.

The layer configuration of each memory cell 61 to 69 will now be described with reference to FIG. 3. FIG. 3 is a cross-sectional view illustrating the layer configuration of the memory cell 61 in the first embodiment. In FIG. 3, the configuration of the memory cell 61 will be mainly described, but the configurations of other memory cells 62 to 69 are similar. The configuration of the memory layer 60 corresponds to the layer configuration of each memory cell 61 to 69.

The memory cell 61 includes an electrode layer 61*a*, a diode layer 61*b*, an electrode layer 61*c*, an electrode layer (lower electrode layer) 61*d*, a resistance change layer 61*e*, a diffusion barrier layer 61*f*, an electrode layer (upper electrode layer) 61*g*, an oxide film (first oxide film) 61*h*, a natural oxide film (second oxide film) 61*i*, a side wall protective film 61*j*, and a side wall protective film 61*k*.

The electrode layer 61*a* is arranged above the line pattern 51. The electrode layer 61*a* is formed of a conductor (e.g., TiN) such as metal. The side wall of the electrode layer 61*a* is covered by the natural oxide film 61*i* and the side wall protective film 61*j*.

The diode layer 61*b* is arranged above the electrode layer 61*a*. The diode layer 61*b* is configured by, for example, an MIM (Metal-Insulator-Metal) structure, a PIN structure (P+poly–Silicon–Intrinsic-N+poly-Silicon), and the like. The diode layer 61*b* has a configuration in which an N type layer, an I type layer, and a P type layer are stacked in the case of the PIN structure. The N type layer is formed of a semiconductor (e.g., silicon) containing N type impurities such as arsenic and phosphorous. The I type layer is formed of a so-called intrinsic semiconductor (e.g., silicon). The P type layer is formed of a semiconductor (e.g., silicon) containing P type impurities such as boron. The diode layer 61*b* functions as a diode DI in the memory cell MC (see FIG. 1). The side wall of the diode layer 61*b* is covered by the natural oxide film 61*i* and the side wall protective film 61*k*.

The electrode layer 61*c* is arranged above the diode layer 61*b*. The electrode layer 61*c* is formed of a conductor (e.g., TiN) such as metal. The electrode layer 61*c* includes a main body portion 61*c*1, and an upper portion 61*c*2 having a narrow width (area in plan view) in a direction perpendicular to a surface of the oxide film 61*h* than the main body portion 61*c*1. The width (area in plan view) in the direction perpendicular to the oxide film 61*h* of the upper portion 61*c*2 is narrower than the width (area in plan view) in the direction perpendicular to the surface of the oxide film 61*h* of each of the electrode layer 61*a*, the diode layer 61*b*, the main body portion 61*c*1, the resistance change layer 61*e*, the diffusion barrier layer 61*f*, and the electrode layer 61*g*. The side wall of the main body portion 61*c*1 is covered by the natural oxide film 61*i* and the side wall protective film 61*k*. The side wall of the upper portion 61*c*2 is covered by the oxide film 61*h* and the side wall protective film 61*k*. The upper surface (one part thereof) of the main body portion 61*c*1 is covered by the oxide film 61*h*.

The electrode layer 61*d* is arranged above the electrode layer 61*c* and is also arranged below the resistance change layer 61*e*, and functions as the lower electrode of the resistance change layer 61*e*. The electrode layer 61*d* is formed of a semiconductor (e.g., polysilicon) such as silicon. The electrode layer 61*d* contains N type impurities such as arsenic and phosphorous. The electrode layer 61*d* contains the N type impurities at higher concentration than the N type layer in the diode layer 61*b*. The electrode layer 61*d* may contain P type impurities such as boron. In this case, the electrode layer 61*d* contains the P type impurities at higher concentration than the P type layer in the diode layer 61*b*.

The width (area in plan view) in the direction perpendicular to the surface of the oxide film 61*h* of the electrode layer 61*d* is narrower than the width (area in plan view) in the direction perpendicular to the surface of the oxide film 61*h* of each of the electrode layer 61*a*, the diode layer 61*b*, the main body portion 61*c*1, the resistance change layer 61*e*, the diffusion barrier layer 61*f*, and the electrode layer 61*g*. The side wall of the electrode layer 61*d* is covered by the oxide film 61*h* and the side wall protective film 61*k*. The thickness of the electrode layer 61*d* is, for example, 20 nm.

The resistance change layer 61*e* is arranged above the electrode layer 61*d*. The resistance change layer 61*e* functions as the resistance change element RW in the memory cell MC. The resistance change layer 61*e* is formed of a material (e.g., $HfO_x$) having at least one material selected from a group consisting of $ZnMn_2O_4$, NiO, NfO, $TiO_2$, $SrZrO_3$, $Pr_{0.7}Ca_{0.3}MnO_3$ as the main component. The side wall of the resistance change layer 61*e* is covered by a side wall protective film (second protective film) 61*n* including a side wall protective film 61*j* and a side wall protective film 61*k*. The thickness of the resistance change layer 61*e* is, for example, 5 nm.

The diffusion barrier layer 61*f* is arranged above the resistance change layer 61*e*. The diffusion barrier layer 61*f* is formed of a material (for example, $TiO_x$) having at least one material selected from a group consisting of $TiO_x$, $AlO_x$, $ZrO_x$, $SiO_2$, $SiN_x$ as the main component. The side wall of the diffusion barrier layer 61*f* is covered by the side wall protective film (second protective film) 61*n* including the side wall protective film 61*j* and the side wall protective film 61*k*. The thickness of the diffusion barrier layer 61*f* is, for example, 0.8 nm.

The electrode layer 61*g* is arranged above the diffusion barrier layer 61*f*, and functions as the upper electrode of the diffusion barrier layer 61*f*. The electrode layer 61*g* is formed of a conductor (e.g., TiN) such as metal. The side wall of the electrode layer 61*g* is covered by the side wall protective film (second protective film) 61*n* including the side wall protective film 61*j* and the side wall protective film 61*k*. The thickness of the electrode layer 61*g* is, for example, 10 nm.

The oxide film 61*h* covers the side wall of the electrode layer 61*d* and the side wall of the upper portion 61*c*2 of the electrode layer 61*c*. The oxide film 61*h* is a film formed when the side wall of the electrode layer 61*d*, the side wall of the upper portion 61*c*2, the upper surface of the man body portion 61*c*1 are respectively oxidized, and for example, the portion covering the side wall of the electrode layer 61*d* is formed of an oxide (e.g., oxide silicon) of the material of the electrode layer 61*d*, and the portion covering the side wall of the upper portion 61*c*2 and the upper surface of the main body portion 61*c*1 is formed of an oxide (e.g., TiON) of the material of the electrode layer 61*c*.

The natural oxide film 61*i* covers the side wall of the main body portion 61*c*1 of the electrode layer 61*c*, the side wall of the diode layer 61*b*, and the side wall of the electrode layer 61*a*. The natural oxide film 61*i* is a film formed when the side wall of the main body portion 61*c*1 of the electrode layer 61*c*, the side wall of the diode layer 61*b*, and the side wall of the electrode layer 61*a* are naturally oxidized. The natural oxide film 61*i* has the portion covering the side wall of the main body portion 61*c*1 formed of an oxide (e.g., TiON) of the material of the electrode layer 61*c*, for example, the portion covering the side wall of the diode layer 61*b* formed of an oxide (e.g., oxide silicon) of the material of the diode layer 61*b*, and the portion covering the side wall of the electrode layer 61*a* formed of an oxide (e.g., TiON) of the material of the electrode layer 61*c* by way of example.

The side wall protective film 61*j* covers the side wall of a stacked structure SST1. For instance, the stacked structure SST1 is a structure in which the resistance change layer 61*e*, the diffusion barrier layer 61*f*, the electrode layer 61*g*, and the line pattern 71*a* are stacked in order. The side wall protective film 61*j* is formed, for example, an insulator (e.g., silicon nitride) that suppresses the oxidation of the side wall of the stacked structure SST1.

The side wall protective film 61*k* covers the side wall of a stacked structure SST2. The stacked structure SST2 is a structure in which the electrode layer 61*a*, the diode layer 61*b*, the electrode layer 61*c*, the electrode layer 61*d*, the resistance change layer 61*e*, the diffusion barrier layer 61*f*, the electrode layer 61*g*, and the line pattern 71*a* are stacked in order, where the side walls of the electrode layer 61*a*, the diode layer 61*b*, and the electrode layer 61*c* (main body portion 61*c*1) are covered by the natural oxide film 61*i*, the side walls of the electrode layer 61*c* (upper portion 61*c*2) and the electrode layer 61*d* are covered by the oxide film 61*h*, and the side wall of the stacked structure SST1 is covered by the side wall protective film 61*j*. The side wall protective film 61*k* is formed, for example, an insulator (e.g., silicon nitride) that suppresses the oxidation of the side wall of the stacked structure SST2.

The oxide film 61*h* that covers the side wall of the electrode layer 61*d* is thicker than the natural oxide film 61*i* that covers the side wall of the diode layer 61*b*.

The side wall protective film 61*k* covers the side wall of the electrode layer 61*d* through the oxide film 61*h*.

The side wall of the portion excluding the stacked structure SST1 in the stacked structure SST2 is covered by one side wall protective film 61*k*, whereas the side wall of the stacked structure SST1 is covered by the side wall protective film 61*n* having a two-layer structure including the side wall protective films 61*j*, 61*k*. The side wall protective film 61*n* that covers the side wall of the stacked structure SST1 is accordingly thicker than the side wall protective film 61*k* that covers the side wall of the electrode layer 61*d* and the oxide film 61*h*.

The manufacturing method of the non-volatile semiconductor storage device 1 according to the first embodiment will now be described using FIGS. 4A to 4F, and FIG. 3. FIGS. 4A to 4F are step cross-sectional views illustrating each step of the manufacturing method of the non-volatile semiconductor storage device 1 according to the first embodiment. FIG. 3 is a cross-sectional view illustrating the layer configuration of the memory cell 61, and is also used as the step cross-sectional view illustrating the step after FIG. 4F in the manufacturing method of the non-volatile semiconductor storage device 1.

Figure 4A:
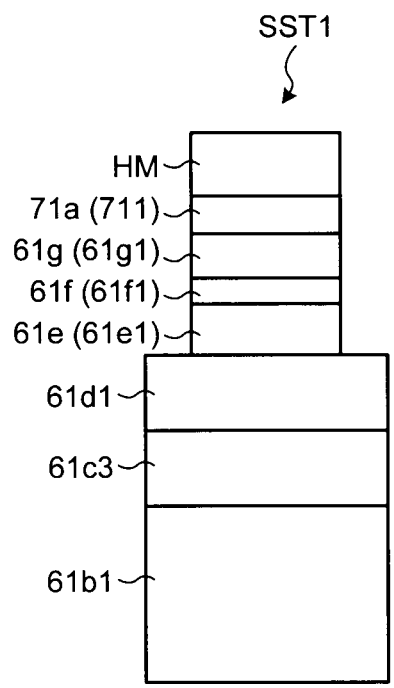
FIGS. 4A to 4F are views illustrating a manufacturing method of the non-volatile semiconductor storage device according to the first embodiment.

In the step illustrated in FIG. 4A, the line pattern 51, and the like, are formed on the upper side of the semiconductor substrate 40 (see FIG. 2) through a known method. A layer (not illustrated) to become the electrode layer 61*a*, a layer 61*b*1 to become the diode layer 61*b*, a layer 61*c*3 to become the electrode layer 61*c*, a layer 61*d*1 to become the electrode layer 61*d*, a layer 61*e*1 to become the resistance change layer 61*e*, a layer 61*f*1 to become the diffusion barrier layer 61*f*, a layer 61*g*1 to become the electrode layer 61*g*, and a layer 711 to become the line pattern 71*a* are formed in order above the line pattern 51. A stacked film in which the layer to become the electrode layer 61*a*, the layer 61*b*1 to become the diode layer 61*b*, the layer 61*c*3 to become the electrode layer 61*c*, the layer 61*d*1 to become the electrode layer 61*d*, the layer 61*e*1 to become the resistance change layer 61*e*, the layer 61*f*1 to become the diffusion barrier layer 61*f*, the layer 61*g*1 to become the electrode layer 61*g*, and the layer 711 to become the line pattern 71*a* are stacked in order is thereby formed.

For instance, the layer 61*d*1 to become the electrode layer 61*d* is formed of polysilicon containing N type impurities such as arsenic and phosphorous through the LPCVD method or the like. For instance, the layer 61*g*1 to become the electrode layer 61*g* is formed of TiN through a reactive sputtering method or the like. The film forming method of each layer may be other film forming methods such as PECVD (Plasma Enhanced CVD), sputtering, and ALD (Atomic Layer Deposition).

A hard mask HM having a predetermined pattern is formed above the layer 711. The hard mask HM is formed, for example, of nitride silicon.

Next, the layers 711, 61*g*1, 61*f*1, and 61*e*1 are then etching processed with the hard mask HM as the mask. In other words, the processing is carried out until the surface of the layer 61*d*1 is exposed while sequentially transferring the pattern of the hard mask HM to the layers 711, 61*g*1, 61*f*1, and 61*e*1 in the above stacked films. The line pattern 71*a*, the electrode layer 61*g*, the diffusion barrier layer 61*f*, and the resistance change layer 61*e* are thereby sequentially formed. In other words, the stacked structure SST1 in which the resistance change layer 61*e*, the diffusion barrier layer 61*f*, the electrode layer 61*g*, and the line pattern 71*a* are stacked in order and the side walls are exposed is formed above the layer 61*d*1 to become the electrode layer 61*d*. In FIG. 4A, a case where the hard mask HM remains even after the etching process is illustrated, but the hard mask HM may be removed after the etching process or during the etching process.

Figure 4B:
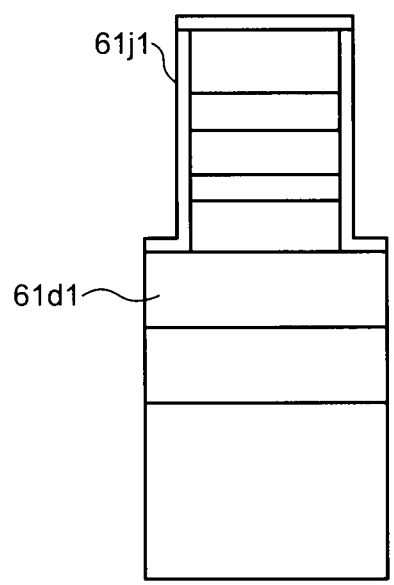

In the step illustrated in FIG. 4B, the side wall protective film 61*j*1 is deposited over the entire surface with SiN through the CVD method (e.g., ALD method or one type of CVD method), and the like. The side wall protective film 61*j*1 is a film to become the side wall protective film 61*j*, and the side wall protective film 61*j* is a film for protecting the side wall of the stacked structure SST1 from oxidant atmosphere.

Figure 4C:
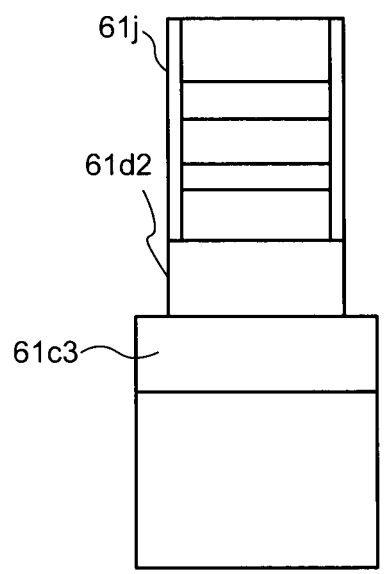

In the step illustrated in FIG. 4C, the portion covering the layer 61*d*1 in the side wall protective film 61*j*1 is removed to expose the surface of the layer 61*d*2. In this case, the portion covering the upper surface of the hard mask HM in the side wall protective film 61*j*1 is also removed, and the upper surface of the hard mask HM is exposed. The side wall protective film 61*j* is thereby formed. The layer 61*d*1 is etching processed with the stacked structure SST1 and the side wall protective film 61*j*1 as the mask. In other words, the layer 61*d*1 is etching processed until the surface of the layer 61*c*3 is exposed while maintaining a state in which the side wall of the stacked structure SST1 is covered by the side wall protective film 61*j*. The electrode layer 61*d*2 in which the side wall is exposed is thereby formed.

Figure 4D:
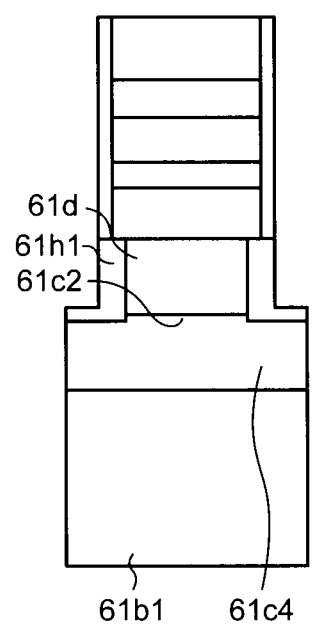

In the step illustrated in FIG. 4D, the side wall of the electrode layer 61*d*2 in which the side wall is exposed and the exposed surface of the layer 61*c*3 are respectively oxidized. The oxidation may be carried out by radical oxidation using oxygen plasma or maybe carried out by thermal oxidation method. In other words, the side wall of the electrode layer 61*d*2 in which the side wall is exposed is oxidized while maintaining a state in which the side wall of the stacked structure SST1 is covered by the side wall protective film 61*j*. The oxide film 61*h*1 that covers the side wall of the electrode layer 61*d* and the surface of the layer 61*c*4 is thereby formed. The oxide film 61*h*1 is a film to become the oxide film 61*h*. The width (area in plan view) in a direction perpendicular to the surface of the oxide film 61*h* of the electrode layer 61*d* becomes narrower than the width (area in plan view) in a direction perpendicular to the surface of the oxide film 61*h* of the stacked structure SST1. The upper portion 61*c*2 having the width (area in plan view) in the direction perpendicular to the surface of the oxide film 61*h* narrower than the stacked structure SST1 is formed in the electrode layer 61*c*4.

Figure 4E:
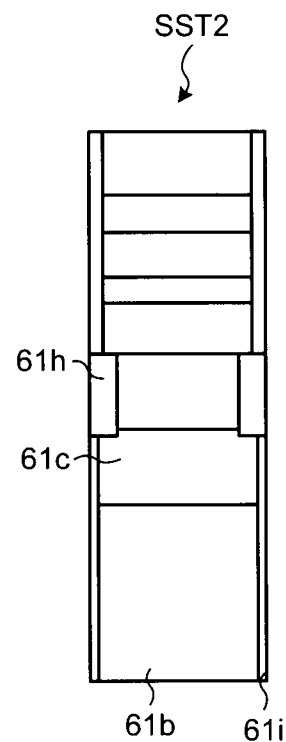

In the step illustrated in FIG. 4E, the layers 61*c*4, 61*b*1 and the layer (not illustrated) to become the electrode layer 61*a* are etching processed with the stacked structure SST1 and the side wall protective film 61*j* as the mask. In other words, the layers 61*c*4, 61*b*1 and the layer (not illustrated) to become the electrode layer 61*a* are sequentially etching processed until the surface of the line pattern 51 (see FIG. 3) is exposed while maintaining a state in which the side wall of the stacked structure SST1 (see FIG. 4A) is covered by the side wall protective film 61*j* (see FIG. 4C). The oxide film 61*h* is thereby formed, and the electrode layer 61*c*, the diode layer 61*b*, and the electrode layer 61*a* (see FIG. 3) are sequentially formed.

In this case, the respective side walls of the electrode layer 61*c*, the diode layer 61*b*, and the electrode layer 61*a* are temporarily exposed to atmosphere (e.g., air) containing oxygen and hence are naturally oxidized. The natural oxide film 61*i* that covers the respective side walls of the electrode layer 61*c*, the diode layer 61*b*, and the electrode layer 61*a* is thereby formed, and the stacked structure SST2 is formed. The stacked structure SST2 is a structure in which the electrode layer 61*a*, the diode layer 61*b*, the electrode layer 61*c*, the electrode layer 61*d*, the resistance change layer 61*e*, the diffusion barrier layer 61*f*, the electrode layer 61*g* and the line pattern 71*a* are stacked in order, where the side walls of the electrode layer 61*a*, the diode layer 61*b*, and the electrode layer 61*c* (main body portion 61*c*1) are covered by the natural oxide film 61*i*, the side walls of the electrode layer 61*c* (upper portion 61*c*2) and the electrode layer 61*d* are covered by the oxide film 61*h*, and the side wall of the stacked structure SST1 is covered by the side wall protective film 61*j* (see FIG. 3).

Figure 4F:
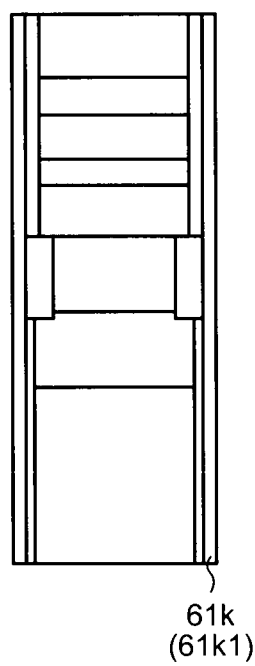

In the step illustrated in FIG. 4F, the side wall protective film 61*k*1 is deposited over the entire surface with SiN, for example, through the CVD method (e.g. ALD method, one type of CVD method). The side wall protective film 61*k*1 is a film to become the side wall protective film 61*k*, and the side wall protective film 61*k* is a film for protecting the side wall of the stacked structure SST2 from oxidant atmosphere.

The portion covering the line pattern 51 (see FIG. 3) and the like in the side wall protective film 61*k*1 is selectively removed to expose the surface of the line pattern 51 and the like. In this case, the portion covering the upper surface of the hard mask HM in the side wall protective film 61*k*1 is also removed to expose the upper surface of the hard mask HM. The side wall protective film 61*k* is thereby formed. An interlayer insulating film is embedded to the periphery etc. of the stacked structure SST2 while maintaining a state in which the side wall of the stacked structure SST2 is covered by the side wall protective film 61*k*.

In the step illustrated in FIG. 3, polishing is carried out until the surface of the line pattern 71*a* is exposed while maintaining planarity of the upper surface through the CMP method and the like. Furthermore, a line pattern 71*b* is formed above the line pattern 71*a* at a width corresponding to the total width of, for example, the stacked structure SST2 and the side wall protective film 61*k*. The line pattern 71 including the line pattern 71*a* and the line pattern 71*b* is thereby formed.

The non-volatile semiconductor storage device 1 is formed in such manner.

Figure 15A:
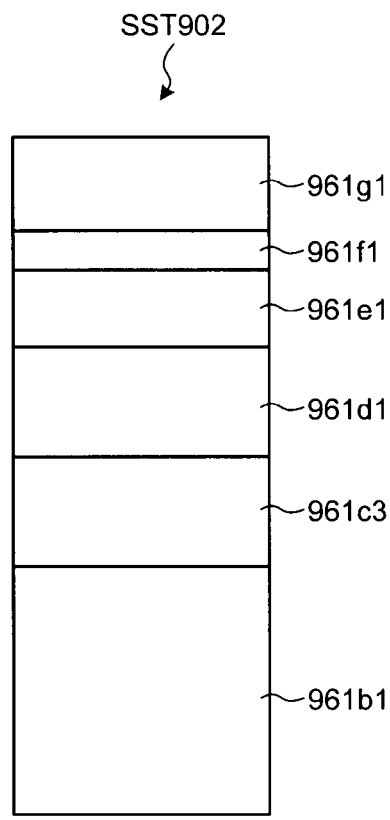
FIGS. 15A and 15B are views illustrating a manufacturing method of a non-volatile semiconductor storage device according to a comparative example.
Figure 15B:
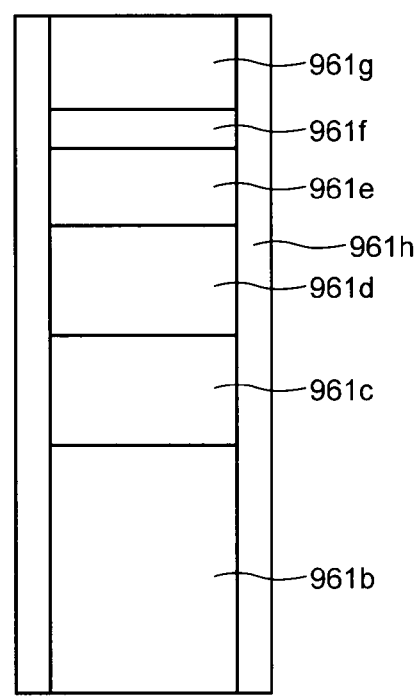

Consider, as a comparison example, a case of carrying out the side wall oxidation of the electrode layer with the side walls of the resistance change layer and the diode layer exposed. Specifically, in the step illustrated in FIG. 15A, a stacked structure SST902 in which a diode layer 961*b*1, an electrode layer 961*c*3, an electrode layer 961*d*1, a resistance change layer 961*e*1, a diffusion barrier layer 961*f*1, and an electrode layer 961*g*1 are stacked in order using a hard mask (not illustrated) is formed. In the step illustrated in FIG. 15B, the side wall of the electrode layer 961*d* is oxidized through radical oxidation and the like using oxygen plasma with the side wall of the stacked structure SST902 remained exposed. In this case, as illustrated in FIG. 15B, the side wall of the resistance change layer 961*e*1 and the side wall of the diode layer 961*b*1 are also oxidized, and an oxide film 961*h* that covers all the side walls of the diode layer 961*b*, the electrode layer 961*c*, the electrode layer 961*d*, the resistance change layer 961*e*, the diffusion barrier layer 961*f*, and the electrode layer 961*g* is formed. The properties of the resistance change layer 961*e* thus may be degraded and the properties of the forward current of the diode layer 961*b* may be degraded.

In the first embodiment, on the other hand, the side wall of the electrode layer 61*d*2 in which the side wall is exposed is oxidized in a state the side wall of the stacked structure SST1 is covered by the side wall protective film 61*j* and in a state the side wall of the diode layer 61*b* is not exposed in the step illustrated in FIG. 4D. The side wall of the electrode layer 61*d*2 thus can selectively be oxidized without exposing the side wall of the resistance change layer 61*e* and the side wall of the diode layer 61*b* to oxidant atmosphere, and hence the effective area of the electrode of the resistance change layer 61*e* in the memory cell MC can be reduced. As a result, the current density of the portion the current flows can be increased while reducing the current amount to be flowed to the resistance change layer 61*e* at the time of the operation of the memory cell MC, so that the resistance change layer 61*e* can be easily switched (transitioned) between the low resistance state and the high resistance state and the operation (low current operation) in which the switching current (Iset/Ireset) of the resistance change layer 61*e* is reduced can be carried out. In other words, according to the manufacturing method of the non-volatile semiconductor storage device 1 according to the first embodiment, the properties of the memory cell MC in the non-volatile semiconductor storage device 1 can be enhanced.

In the first embodiment, in the memory cell MC of the non-volatile semiconductor storage device 1 according to the first embodiment, the oxide film 61*h* covering the side wall of the electrode layer 61*d* is thicker than the natural oxide film 61*i* covering the side wall of the diode layer 61*b*. This structure can be manufactured by selectively oxidizing the side wall of the electrode layer 61*d*2 without exposing the side wall of the resistance change layer 61*e* and the side wall of the diode layer 61*b* to the oxidant atmosphere, as described above. In other words, according to the configuration of the non-volatile semiconductor storage device 1 according to the first embodiment, the non-volatile semiconductor storage device 1 suited for enhancing the properties of the memory cell MC can be provided.

In the first embodiment, the side wall protective film 61*k* covers the side wall of the electrode layer 61*d* through the oxide film 61*h*. In the step illustrated in FIG. 4F, the structure can be obtained by manufacturing so as to obtain a state in which the side wall of the diode layer 61*d* is covered by the side wall protective film 61*k* and suppress the oxidation of the side wall of the diode layer 61*d* when embedding the interlayer insulating film to the periphery etc. of the stacked structure SST2. In other words, the non-volatile semiconductor storage device 1 suited for enhancing the properties of the memory cell MC can be provided from such standpoint.

In the first embodiment, the side wall protective film 61*n* covering the side wall of the stacked structure SST1 has a two-layer structure including the side wall protective films 61*j*, 61*k*, and is thicker than the side wall protective film 61*k* covering the side wall of the electrode layer 61*d* and the oxide film 61*h*. In the step illustrated in FIG. 4D, this structure can be obtained by manufacturing to obtain a state in which the side wall of the resistance change layer 61e is covered by the side wall protective film 61j and suppress the oxidation of the side wall of the resistance change layer 61e when oxidizing the side wall of the electrode layer 61d2. In other words, the non-volatile semiconductor storage device 1 suited for enhancing the properties of the memory cell MC can be provided from such standpoint as well.

In the first embodiment, a configuration in which the diode layer 61b is arranged between the electrode layer 61a and the electrode layer 61c has been described, but the diode layer 61b may be arranged between the electrode layer 61g and the line pattern 71 in the memory cell MC. This structure can be obtained by manufacturing so as to obtain a state in which the side wall of the diode layer 61d is covered by the side wall protective film 61j and suppress the oxidation of the side wall of the diode layer 61d when oxidizing the side wall of the electrode layer 61d2. In other words, the non-volatile semiconductor storage device 1 suited for enhancing the properties of the memory cell MC can be provided by such configuration. In this case as well, the natural oxide film may be formed on the side wall of the diode layer 61b since the diode layer 61b is temporarily exposed to the atmosphere (e.g., air) containing oxygen. The side wall protective film 61j covers the side wall of the diode layer 61b and the natural oxide film.

Alternatively, in the step illustrated in FIG. 4D, the slimming of the electrode layer 61d2 may be carried out by repeating over the process of oxidizing the exposed side wall of the electrode layer 61d2 and the process of selectively removing the oxide film formed on the side wall a plurality of times when forming the oxide film 61h on the side wall of the electrode layer 61d2. The process of selectively removing the oxide film formed on the side wall may be carried out by wet etching, and the like that uses HF and the like for the etchant. The width (area in plan view) in the direction perpendicular to the surface of the oxide film 61h of the electrode layer 61d thus can be efficiently reduced.

Figure 5:
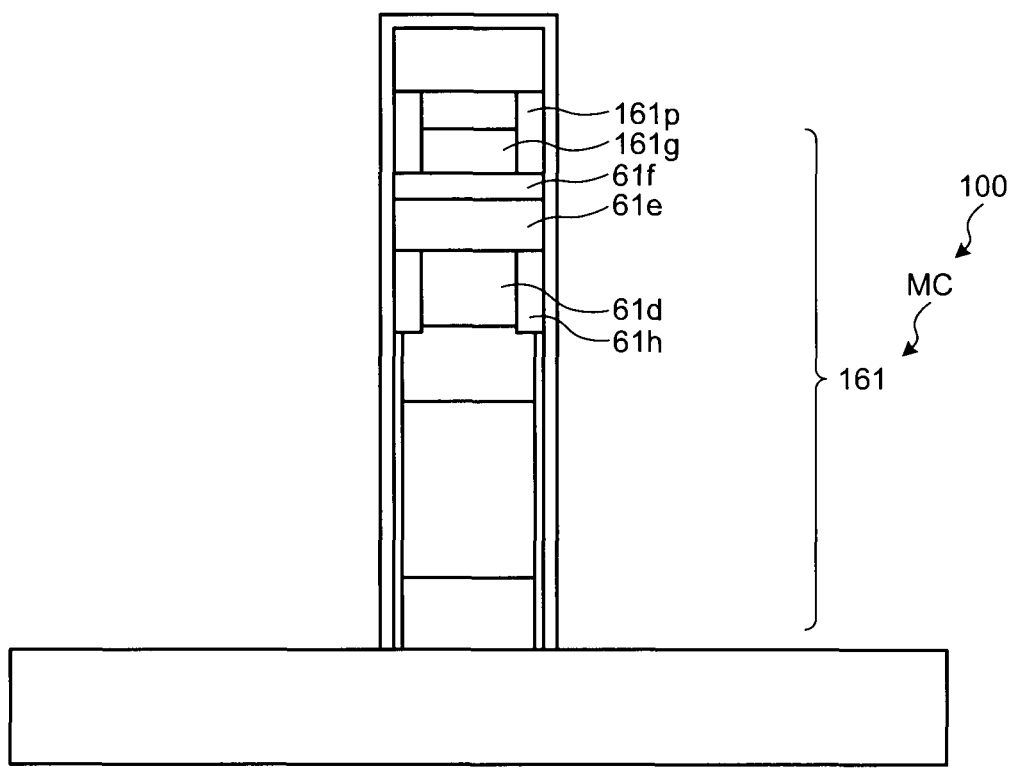
FIG. 5 is a view illustrating a configuration of a non-volatile semiconductor storage device according to a variant of the first embodiment.

Alternatively, if the resistance change layer 61e is formed of a material that is less likely to oxidize of the side wall thereof, the oxide film may be formed on the side walls of both the upper electrode and the lower electrode of the resistance change layer 61e. For instance, as illustrated in FIG. 5, the memory cell MC (memory cell 161) in the non-volatile semiconductor storage device 100 further includes an oxide film 161p that covers the side wall of the electrode layer 161g functioning as the upper electrode in addition to the oxide film 61h that covers the side wall of the electrode layer 61d functioning as the lower electrode. The width (area in plan view) in the direction perpendicular to the surface of the oxide film 161p of the electrode layer 161g is narrower than the width (area in plan view) in the direction perpendicular to the surface of the oxide film 161p of the resistance change layer 61e. This structure can be manufactured by selectively oxidizing the side walls of the electrode layers 61d2, 161g2 without exposing the side wall of the diode layer 61b to the oxidant atmosphere, as illustrated in FIG. 6, when the resistance change layer 61e is formed of a material that is less likely to oxidize of the side wall thereof.

Figure 6A:
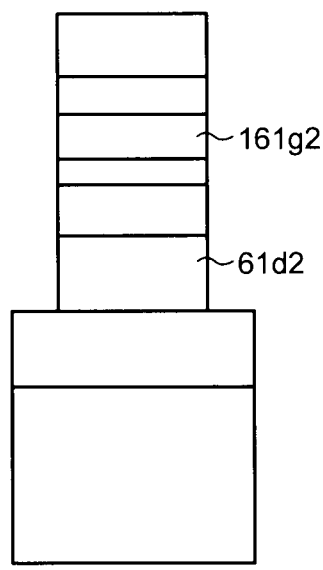
FIGS. 6A to 6E are views illustrating a manufacturing method of a non-volatile semiconductor storage device according to a variant of the first embodiment.

Specifically, in the step illustrated in FIG. 6A, the process similar to the process illustrated in FIG. 4C is carried out without forming the side wall protective film 61j1 (without carrying out the step illustrated in FIG. 4B) after carrying out the process similar to the step illustrated in FIG. 4A. In the step illustrated in FIG. 6B, the side walls of the electrode layers 61d2, 161g2 are oxidized in the exposed state. In the steps illustrated in FIGS. 6C to 6E, process similar to the steps illustrated in FIGS. 4E and 4F are carried out.

Figure 6B:
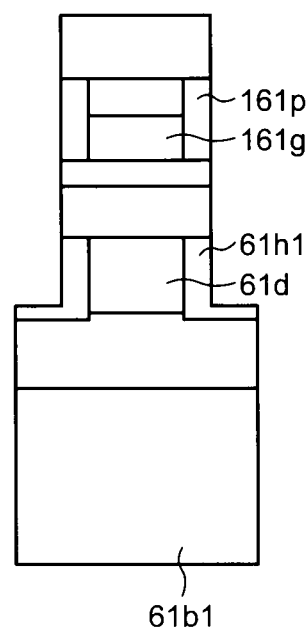
Figure 6C:
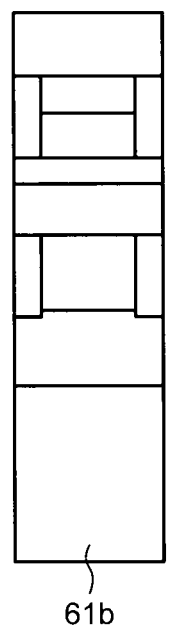
Figure 6D:
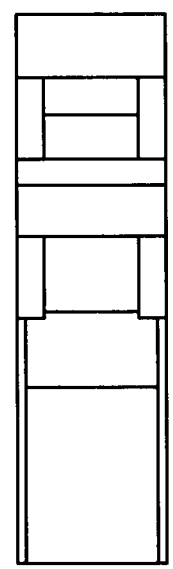
Figure 6E:
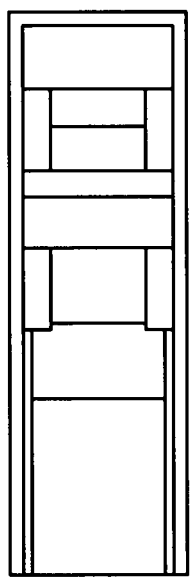

Therefore, in the step illustrated in FIG. 6B, the side walls of the electrode layers 61d2, 161g2 can selectively be oxidized without exposing the side wall of the diode layer 61b to the oxidant atmosphere since the side walls of the electrode layers 61d2, 161g2 (see FIG. 6A) are oxidized in a state the side wall of the diode layer 61b is not exposed.

Figure 7:
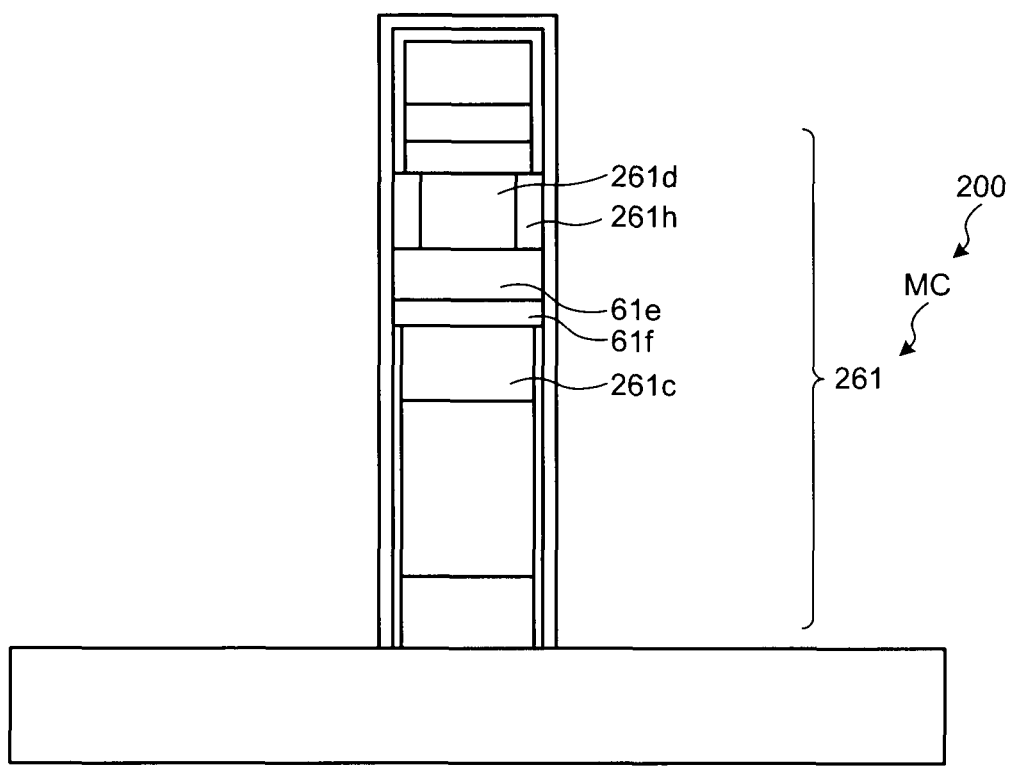
FIG. 7 is a view illustrating a configuration of a non-volatile semiconductor storage device according to another variant of the first embodiment.

Alternatively, the oxide film may be formed on the side wall of the upper electrode without forming the oxide film on the side wall of the lower electrode of the resistance change layer 61e. For instance, as illustrated in FIG. 7, the memory cell MC (memory cell 261) in the non-volatile semiconductor storage device 200 includes an oxide film 261h that covers the side wall of the electrode layer 261d functioning as the upper electrode without including an oxide film that covers the side wall of the electrode layer 261c functioning as the lower electrode. The width (area in plan view) in the direction perpendicular to the surface of the oxide film 261h of the electrode layer 261d is narrower than the width (area in plan view) in the direction perpendicular to the surface of the respective oxide film 261h of the resistance change layer 61e, the diffusion barrier layer 61f, and the electrode layer 261c. In this case, the stacked order of the resistance change layer 61e may be the opposite of that in the first embodiment. This structure can be manufactured by selectively oxidizing the side wall of the electrode layer 261d2 without exposing the side walls of the resistance change layers 61e, 61f and the side wall of the diode layer 61b to the oxidant atmosphere, as illustrated in FIGS. 8A to 8F.

Figure 8A:
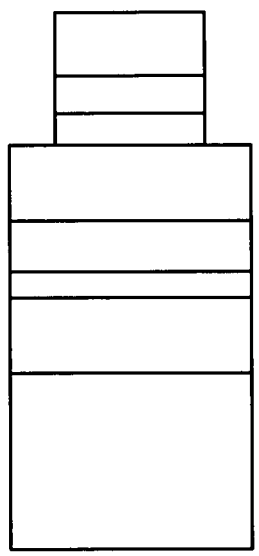
FIGS. 8A to 8F are views illustrating a manufacturing method of a non-volatile semiconductor storage device according to another variant of the first embodiment.
Figure 8B:
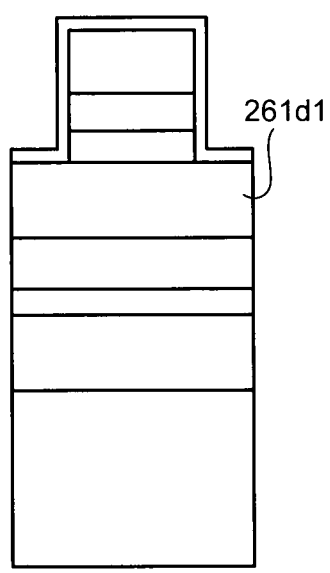
Figure 8C:
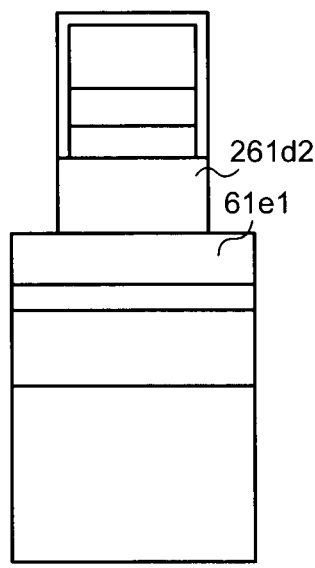

Specifically, in the steps illustrated in FIGS. 8A and 8B, the layer 261d1 is etching processed until the surface of the layer 61e1 is exposed in the step illustrated in FIG. 8C after carrying out the processes similar to the steps illustrated in FIGS. 4A and 4B. The electrode layer 261d2 in which the side wall is exposed is thereby formed. In the step illustrated in FIG. 8D, the side wall of the electrode layer 261d2 in which the side wall is expose is oxidized. The oxide film 261h that covers the side wall of the electrode layer 261d is thereby formed. In the steps illustrated in FIGS. 8E and 8F, the processes similar to the steps illustrated in FIGS. 4E and 4F are carried out.

Figure 8D:
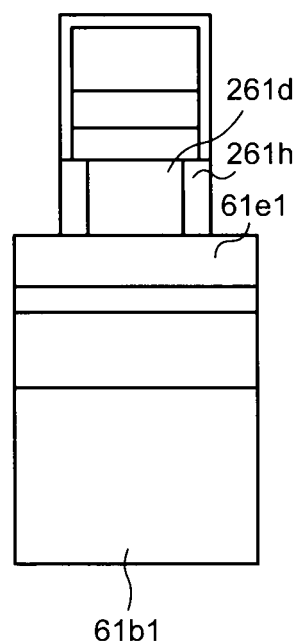
Figure 8E:
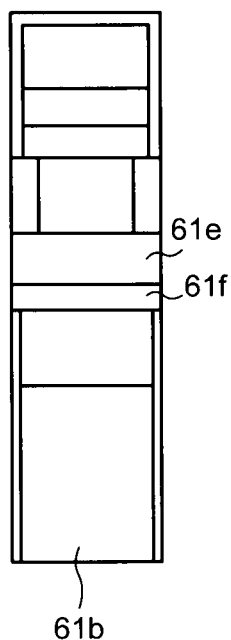
Figure 8F:
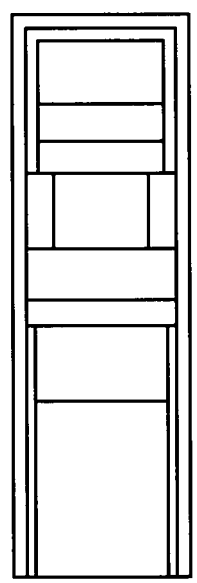

Thus, in the step illustrated in FIG. 8D, the side wall of the electrode layer 261d2 can be selectively oxidized without exposing the side wall of the resistance change layer 61e and the side wall of the diode layer 61b to the oxidant atmosphere since the side wall of the electrode layer 261d2 is oxidized in a state the side wall of the resistance change layer 61e and the side wall of the diode layer 61b are not exposed.

(Second Embodiment)

Figure 9:
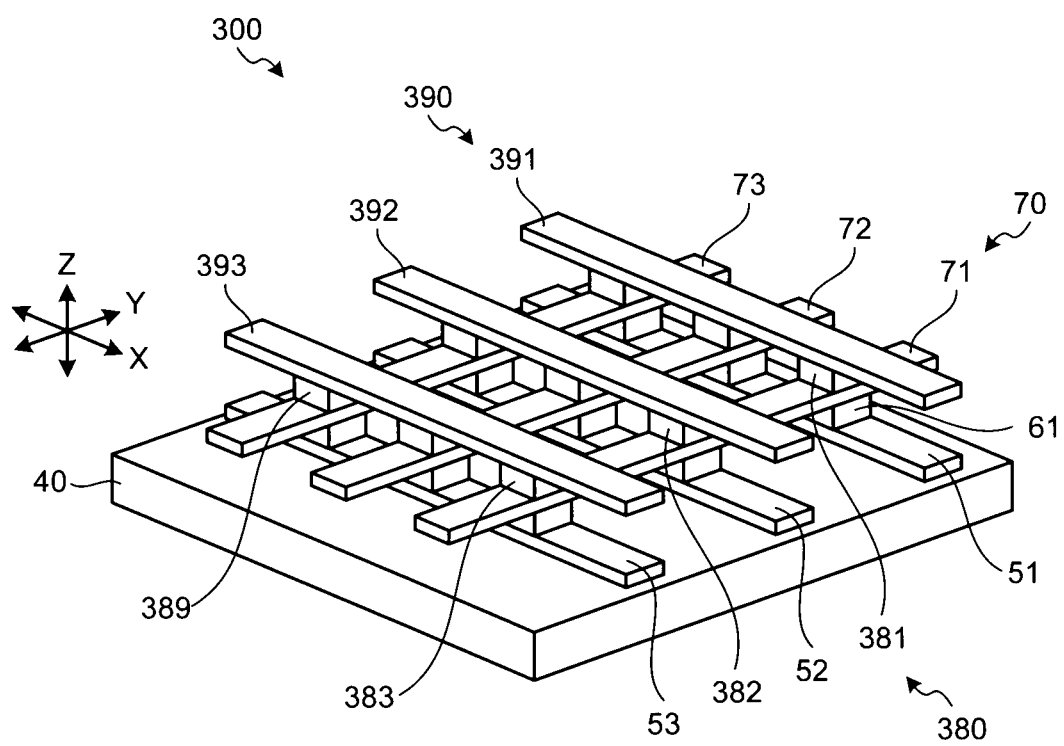
FIG. 9 is a view illustrating a configuration of a non-volatile semiconductor storage device according to a second embodiment.

A non-volatile semiconductor storage device 300 according to a second embodiment will now be described using FIG. 9. FIG. 9 is a view illustrating one example of a schematic layer configuration in the non-volatile semiconductor storage device 300 according to the second embodiment. In the following, the portion different from the first embodiment will be centrally described.

A case in which a plurality of memory cells is arrayed two-dimensionally has been described in the first embodiment, but a plurality of memory cells is arrayed three-dimensionally in the second embodiment.

Specifically, the non-volatile semiconductor storage device 300 further includes a second memory layer 380 and a third conductive layer 390.

The second memory layer 380 is arranged between the second conductive layer 70 and the third conductive layer 390. The configuration of the second memory layer 380 is similar to the configuration of the memory layer 60.

The second memory layer 380 includes a plurality of memory cells 381 to 389. Each memory cell 381 to 389 functions as the memory cell MC. The plurality of memory cells 381 to 389 are arrayed in a matrix form in the X direction and the Y direction. Each memory cell 381 to 389 is arranged at a position where the line pattern 71 to 73 and a line pattern 391 to 393, to be described later, intersect. The array of the plurality of memory cells 381 to 389 is a so-called cross point type. In other words, the memory cell array 10 (see FIG. 1) includes the array of the plurality of memory cells 61 to 69, and the array of the plurality of memory cells 381 to 389. In other words, in the memory cell array 10, the plurality of memory cells MC are arrayed also in a Z direction in addition to the X direction and the Y direction.

The third conductive layer 390 is arranged above the second memory layer 380. The third conductive layer 390 is formed of a material that has resistance to heat and that has low resistance value, for example, a conductor such as metal. The third conductive layer 390 is, for example, configured by a layer including at least one of tungsten (W), titanium (Ti), tantalum (Ta), and a nitride as a main component, or a stacked structure thereof.

The third conductive layer 390 includes a plurality of line patterns 391 to 393. Each line pattern 391 to 393 functions as a word line WL. The plurality of line patterns 391 to 393 are arrayed with a predetermined pitch in the Y direction. Each line pattern 391 to 393 extends in the X direction.

Figure 10:
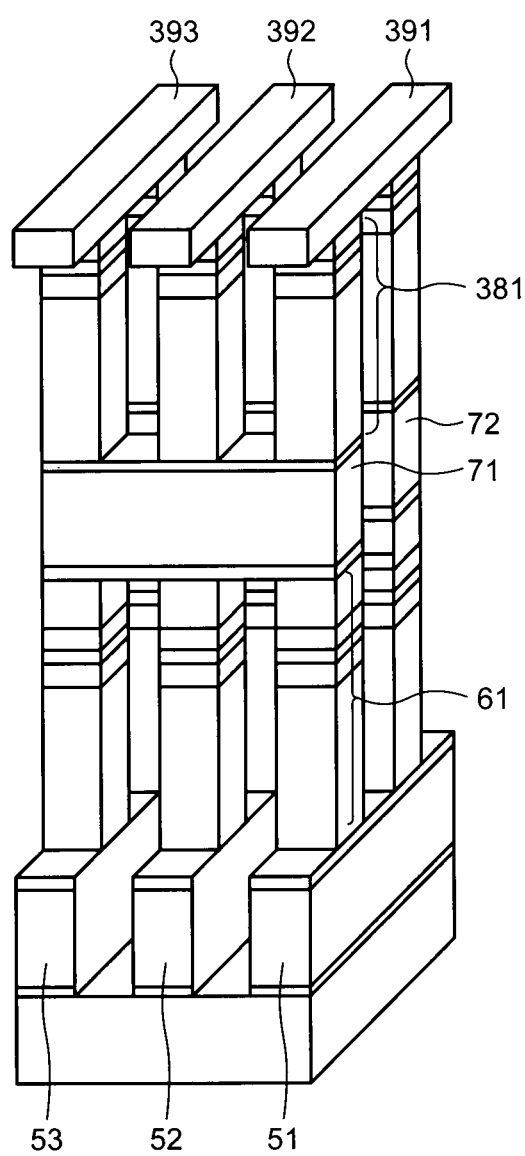
FIG. 10 is a view illustrating a configuration of the non-volatile semiconductor storage device according to the second embodiment.
Figure 11:
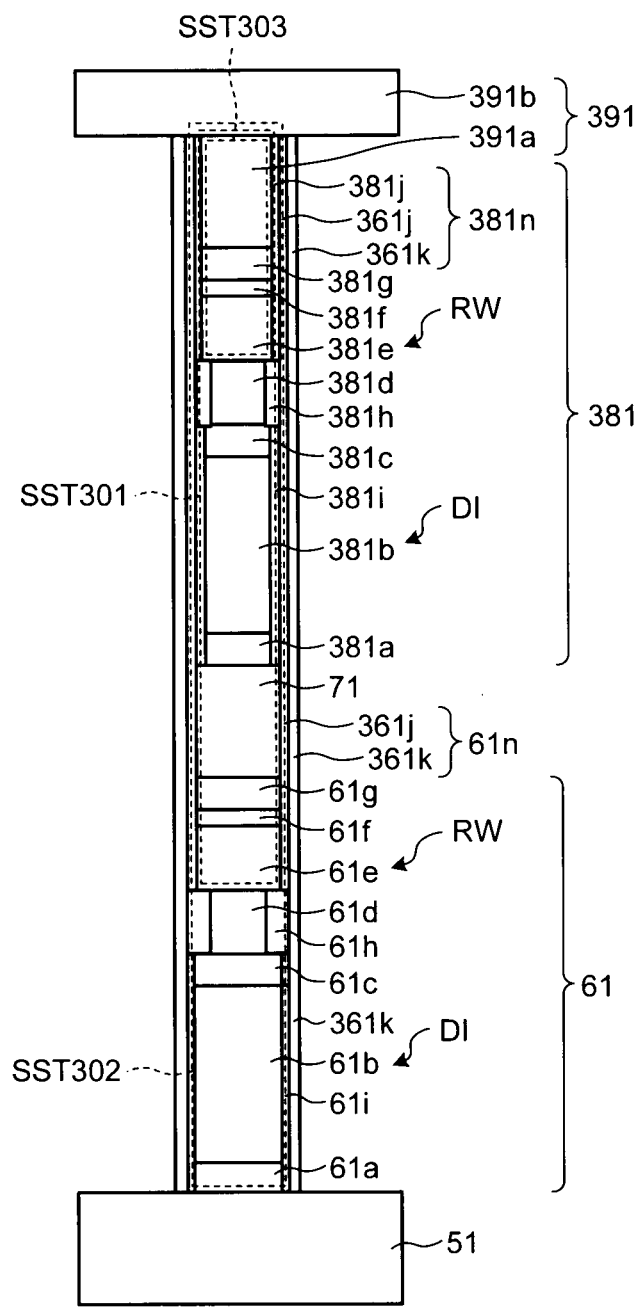
FIG. 11 is a view illustrating a configuration of the non-volatile semiconductor storage device according to the second embodiment.

As illustrated in FIG. 10, the memory cell (second memory cell) 381 is arranged above the memory cell 61 through the line pattern 71. The memory cell 381 has a layer configuration corresponding to the memory cell 61. In other words, as illustrated in FIG. 11, the memory cell 381 includes an electrode layer 381a, a diode layer 381b, an electrode layer 381c, an electrode layer (second lower electrode layer) 381d, a resistance change layer (second resistance change layer) 381e, a diffusion barrier layer 381f, an electrode layer (second upper electrode layer) 381g, an oxide film (third oxide film) 381h, a natural oxide film 381i, a side wall protective film 381j, a side wall protective film 361j, and a side wall protective film 361k.

The oxide film 381h that covers the side wall of the electrode layer 381d serving as the lower electrode is thicker than the natural oxide films 61i, 381i and thinner than the oxide film 61h that covers the side wall of the electrode layer 61d serving as the lower electrode in the memory cell 61.

The side wall protective film 381j covers the side wall of the stacked structure SST303. For example, the stacked structure SST303 is a structure in which the resistance change layer 381e to the line pattern 391a are stacked in order. The side wall protective film 361j covers the side wall of the stacked structure SST301. The stacked structure SST301 is, for example, mainly a structure in which the resistance change layer 61e to the line pattern 391a illustrated in FIG. 11 are stacked in order. The side wall protective film 361k covers the side wall of the stacked structure SST302. For instance, the stacked structure SST302 is mainly a structure in which the electrode layer 61a to the line pattern 391a illustrated in FIG. 11 are stacked in order.

The side wall of the portion excluding the stacked structure SST301 in the stacked structure SST302 is covered by one side wall protective film 361k, and the side wall of the portion excluding the stacked structure SST303 in the stacked structure SST301 is covered by the side wall protective film 61n having a two-layer structure including the side wall protective films 361j, 361k, whereas the side wall of the stacked structure SST303 is covered by the side wall protective film 381n having a three-layer structure including the side wall protective films 381j, 361j, 361k. Accordingly, the side wall protective film 381n (381j, 361j, 361k) that covers the side wall of the stacked structure SST303 is thicker than the side wall protective film 61n (361j, 361k) that covers the side wall of the electrode layer 381d and thicker than the side wall protective film 361k that covers the side wall of the electrode layer 61d.

As illustrated in FIGS. 12A to 12D and FIG. 11, the manufacturing method of the non-volatile semiconductor storage device 300 differs from that in the first embodiment in the following point.

Figure 12A:
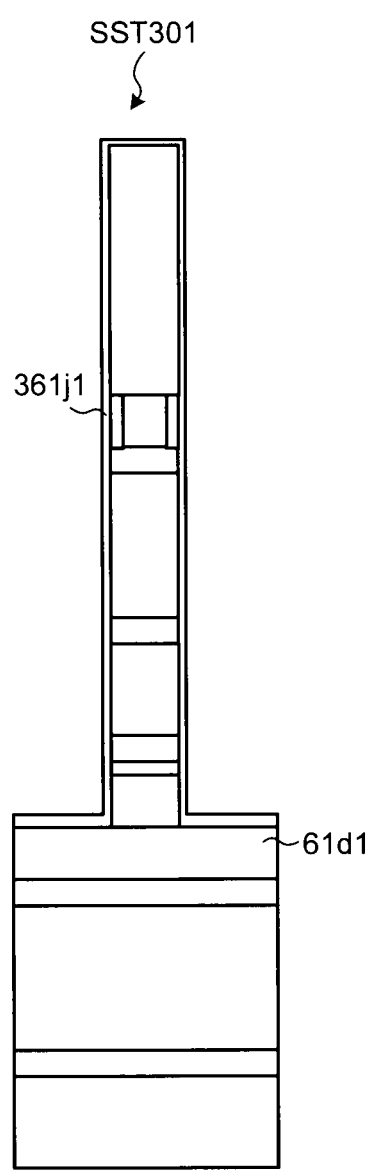
FIGS. 12A to 12D are views illustrating a manufacturing method of the non-volatile semiconductor storage device according to the second embodiment.

The step illustrated in FIG. 12A is carried out after carrying out the processes similar to the steps illustrated in FIGS. 4A to 4F and forming the memory cell 381. In the step illustrated in FIG. 12A, the stacked structure SST301 in which the resistance change layer 381e to the hard mask HM are stacked in order is formed, and the side wall protective film 361j1 is deposited over the entire surface with SiN.

Figure 12B:
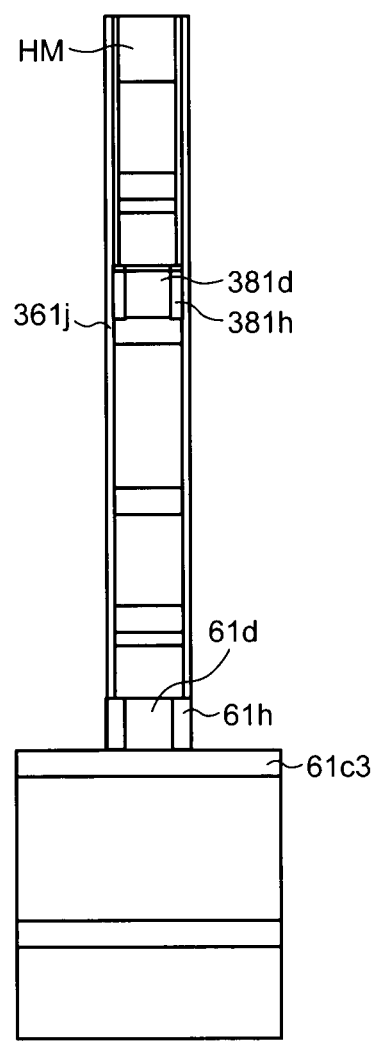

In the step illustrated in FIG. 12B, the portion covering the layer 61d1 in the side wall protective film 361j1 is removed to expose the surface of the layer 61d1. In this case, even the portion covering the upper surface of the hard mask HM in the side wall protective film 361j1 may be removed thus exposing the upper surface of the hard mask HM. The side wall protective film 361j is thereby formed. The layer 61d1 is then etching processed with the stacked structure SST301 and the side wall protective film 361j as the mask. In other words, the layer 61d1 is etching processed until the surface of the layer 61c3 is exposed while maintaining a state in which the side wall of the stacked structure SST301 is covered by the side wall protective film 361j. The electrode layer 61d2 (see FIG. 4C) in which the side wall is exposed is thereby formed. The side wall of the electrode layer 61d2 in which the side wall is exposed is then oxidized to form the oxide film 61h that covers the side wall of the electrode layer 61d.

The amount of oxidation of the side wall, that is, the thickness of the oxide film 61h is adjusted so that the width (area in plan view) in the direction perpendicular to the surface of the oxide film 61h of the electrode layer 61d becomes substantially the same as the width (area in plan view) in the direction perpendicular to a surface of the oxide film 381h of the electrode layer 381d. In this case, the slimming process of repeating over the process of oxidizing the exposed side wall of the electrode layer 61d2 and the process of selectively removing the oxide film formed on the side wall a plurality of times, as described in the variant of the first embodiment, may be carried out. The thickness of the oxide film 61h can easily be adjusted to become thicker by carrying out such slimming process.

Figure 12C:
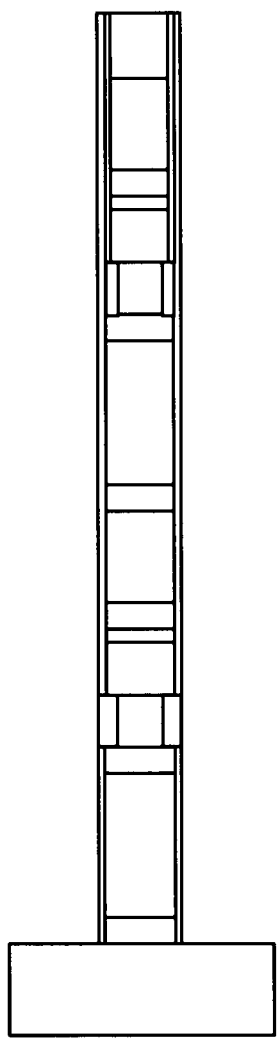

In the step illustrated in FIG. 12C, the process similar to the step illustrated in FIG. 4E is carried out.

Figure 12D:
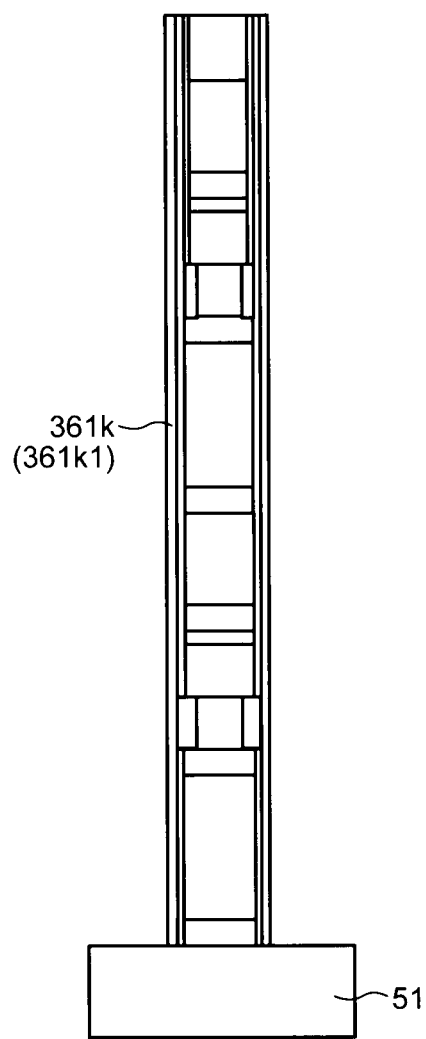

In the step illustrated in FIG. 12D, the side wall protective film 361k1 is deposited over the entire surface with SiN. The portion covering the line pattern 51 and the like in the side wall protective film 361k1 is removed to expose the surface of the line pattern 51 and the like. In this case, even the portion covering the upper surface of the hard mask HM in the side wall protective film 361k1 may be removed thus exposing the upper surface of the hard mask HM. The side wall protective film 361k is thereby formed. The inter-layer insulating film is embedded to the periphery etc. of the stacked structure SST302 while maintaining a state in which the side wall of the stacked structure SST302 is covered by the side wall protective film 361k.

In the step illustrated in FIG. 11, polishing is carried out until the surface of the line pattern 391a is exposed while maintaining planarity of the upper surface through the CMP method and the like. Furthermore, a line pattern 391b is formed above the line pattern 391a at a width corresponding to the total width of the stacked structure SST302 and the side wall protective film 361k. The line pattern 391 including the line pattern 391a and the line pattern 391b is thereby formed.

As described above, in the non-volatile semiconductor storage device 300 according to the second embodiment, the oxide film 381h that covers the side wall of the electrode layer 381d serving as the lower electrode in the memory cell 381 on the upper side is thicker than the natural oxide film 381i that covers the side wall of the diode layer 381b and thinner than the oxide film 61h that covers the side wall of the electrode layer 61d serving as the lower electrode in the memory cell 61 on the lower side. According to such structure, the width (area in plan view) in the direction perpendicular to the surface of the oxide film 381h of the electrode layer 381d in the memory cell 381 on the upper side and the width (area in plan view) in the direction perpendicular to the surface of the oxide film 61h of the electrode layer 61d in the memory cell 61 on the lower side can be aligned. In other words, according to the configuration of the non-volatile semiconductor storage device 300 according to the second embodiment, the effective area of the electrode can be reduced to substantially the same extent in the upper and lower memory cells MC, so that the non-volatile semiconductor storage device 300 suited for reducing the property variation of the memory cell MC can be provided in addition to the effect of the first embodiment.

Figure 13:
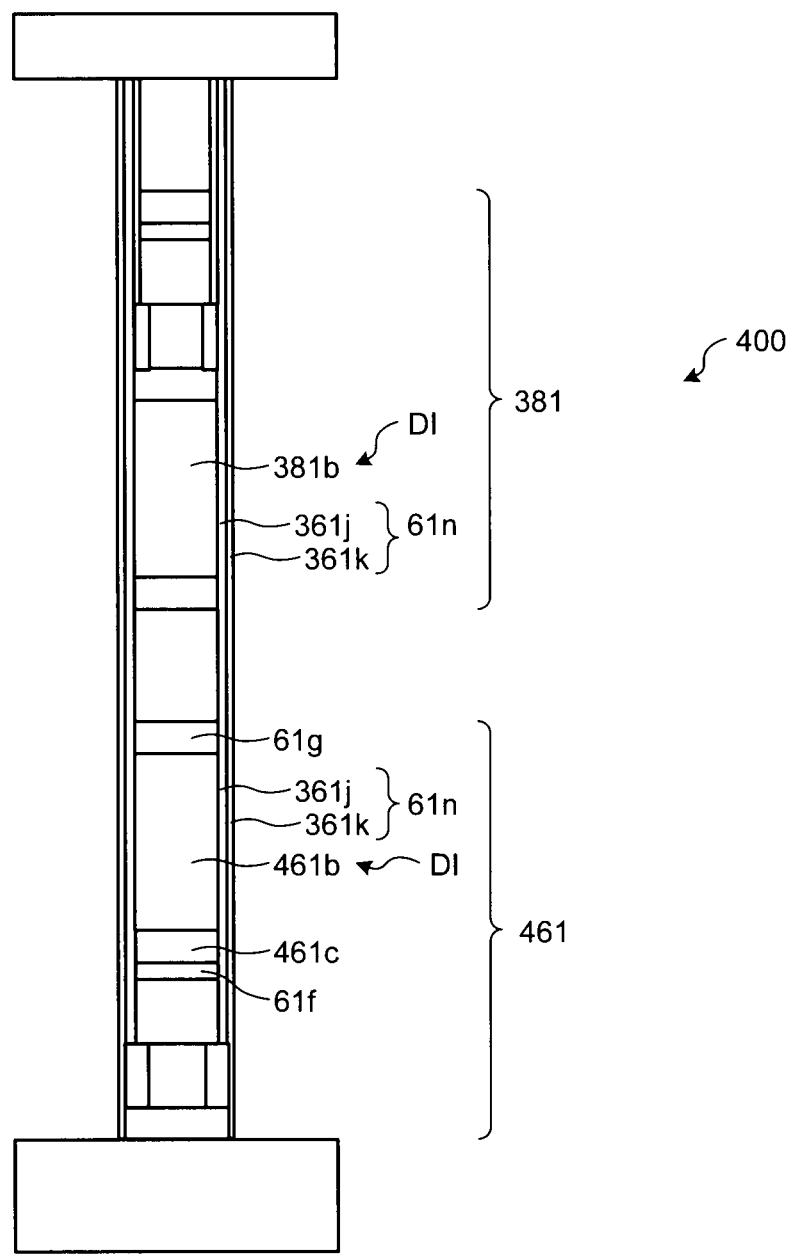
FIG. 13 is a view illustrating a configuration of a non-volatile semiconductor storage device according to a variant of the second embodiment.
Figure 14A:
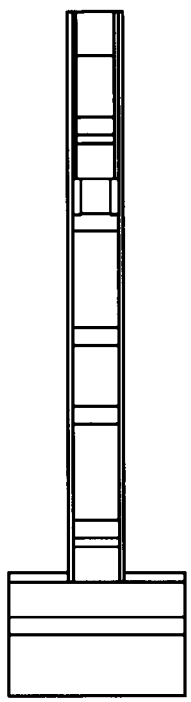
FIGS. 14A to 14D are views illustrating a manufacturing method of the non-volatile semiconductor storage device according to the variant of the second embodiment.
Figure 14B:
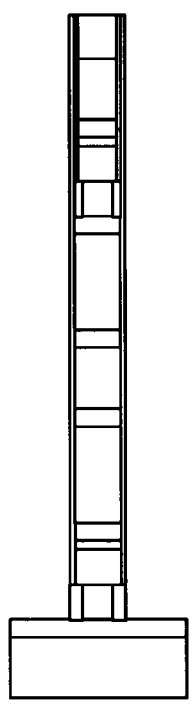
Figure 14C:
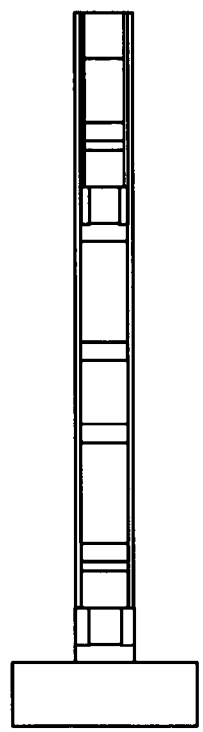
Figure 14D:
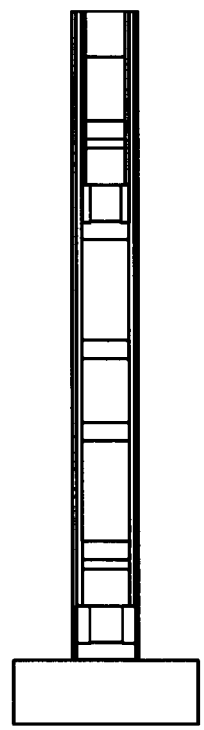

As illustrated in FIG. 13, in a non-volatile semiconductor storage device 400, the stacked position of the diode layer may differ between the memory cell 381 on the upper side and the memory cell 461 on the lower side. In other words, in the memory cell 461 on the lower side, the electrode layer 461c and the diode layer 461b may be stacked in order between the diffusion barrier layer 61f and the electrode layer 61g.

In other words, in the second embodiment, the side wall of the diode layer 61b in the memory cell 61 on the lower side is covered by one side wall protective film 361k, whereas the side wall of the diode layer 381b in the memory cell 381 on the upper side is covered by the side wall protective film 61n having a two-layer structure including the side wall protective film 361j and the side wall protective film 361k. Thus, the width (area in plan view) in the direction perpendicular to the surface of the oxide film 61h of the diode layer may differ between the upper and lower memory cells MC.

In the non-volatile semiconductor storage device 400, on the other hand, the side wall of the diode layer 461b in the memory cell 461 on the lower side and the side wall of the diode layer 381b in the memory cell 381 on the upper side are both covered by the side wall protective film 61n having a two-layer structure including the side wall protective film 361j and the side wall protective film 361k. This structure is a structure suited for aligning the width (area in plan view) in the direction perpendicular to the surface of the oxide film 61h of the diode layer in the upper and lower memory cells MC. In other words, according to the configuration of the non-volatile semiconductor storage device 400 according to a variant of the second embodiment, the IV properties of the diode layer can be aligned to the same extent in the upper and lower memory cells MC in addition to reducing the effective area of the electrode to substantially the same extent in the upper and lower memory cells MC.

As illustrated in FIGS. 14A to 14D, the manufacturing method of the non-volatile semiconductor storage device 400 is similar to that in the second embodiment other than that the position of stacking the diode layer 461b in the memory cell 461 on the lower side is different.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor storage device comprising:
    a first line;
    a second line that intersects the first line; and
    a memory cell arranged at a position where the first line and the second line intersect, wherein
    the memory cell includes
        a resistance change layer,
        an upper electrode layer arranged above the resistance change layer,
        a lower electrode layer arranged below the resistance change layer,
        a diode layer arranged above the upper electrode layer or below the lower electrode layer,
        a first oxide film existing on a side wall of at least one electrode layer of the upper electrode layer or the lower electrode layer,
        a second oxide film existing on a side wall of the diode layer, and
        a protective film to cover the side wall of the at least one electrode layer and the first oxide film; and wherein
    a film thickness of the first oxide film is thicker than a film thickness of the second oxide film,
    the diode layer is arranged below the lower electrode layer, and
    the protective film further covers the side wall of the diode layer and the second oxide film.

2. The non-volatile semiconductor storage device according to claim 1, wherein
    the first oxide film does not exist on the side wall of the upper electrode layer but exists on the side wall of the lower electrode layer.

3. The non-volatile semiconductor storage device according to claim 2, wherein
    a width of the lower electrode layer in a direction perpendicular to a surface of the first oxide film is smaller than a width of the resistance change layer in a direction perpendicular to the surface of the first oxide film.

4. The non-volatile semiconductor storage device according to claim 1, wherein
    the first oxide film exists on the side wall of the upper electrode layer but does not exist on the side wall of the lower electrode layer.

5. The non-volatile semiconductor storage device according to claim 4, wherein
    a width of the upper electrode layer in a direction perpendicular to a surface of the first oxide film is smaller than a width of the resistance change layer in a direction perpendicular to the surface of the first oxide film.

6. The non-volatile semiconductor storage device according to claim 1, wherein
    the first oxide film exists on the side wall of the upper electrode layer and also exists on the side wall of the lower electrode layer.

7. The non-volatile semiconductor storage device according to claim 6, wherein
a width of the upper electrode layer in a direction perpendicular to a surface of the first oxide film is smaller than a width of the resistance change layer in a direction perpendicular to the surface of the first oxide film; and
a width of the lower electrode layer in a direction perpendicular to the surface of the first oxide film is smaller than a width of the resistance change layer in a direction perpendicular to the surface of the first oxide film.

8. The non-volatile semiconductor storage device according to claim 1, wherein
the second line is arranged above the memory cell,
the memory cell further includes a second protective film to cover a side wall of a stacked structure between the at least one electrode layer in the memory cell and the second line, and
the second protective film is thicker than the protective film.

9. The non-volatile semiconductor storage device according to claim 8, wherein
the diode layer is arranged below the lower electrode layer, and
the protective film further covers the side wall of the diode layer and the second oxide film.

10. The non-volatile semiconductor storage device according to claim 8, wherein
the diode layer is arranged above the upper electrode layer, and
the second protective film further covers the side wall of the diode layer and the second oxide film.

11. The non-volatile semiconductor storage device according to claim 1, further comprising
a second memory cell arranged above the memory cell through the second line, wherein
the second memory cell includes
a second resistance change layer,
a second upper electrode layer arranged above the second resistance change layer,
a second lower electrode layer arranged below the second resistance change layer,
a second diode layer arranged above the second upper electrode layer or below the second lower electrode layer, and
a third oxide film existing on a side wall of at least one electrode layer of the second upper electrode layer or the second lower electrode layer,
a film thickness of the first oxide film is thicker than a film thickness of the second oxide film and a film thickness of the third oxide film, and
the film thickness of the third oxide film is thicker than the film thickness of the second oxide film.

12. The non-volatile semiconductor storage device according to claim 11, wherein
the diode layer is arranged above the upper electrode layer, and
the second diode layer is arranged below the second lower electrode layer.

13. A non-volatile semiconductor storage device comprising:
a first line;
a second line that intersects the first line; and
a memory cell arranged at a position where the first line and the second line intersect, wherein
the memory cell includes
a resistance change layer,
an upper electrode layer arranged above the resistance change layer,
a lower electrode layer arranged below the resistance change layer,
a diode layer arranged above the upper electrode layer or below the lower electrode layer,
a first oxide film existing on a side wall of at least one electrode layer of the upper electrode layer or the lower electrode layer,
a second oxide film existing on a side wall of the diode layer,
a protective film to cover the side wall of the at least one electrode layer and the first oxide film, and
a second protective film to cover a side wall of a stacked structure between the at least one electrode layer in the memory cell and the second line; and wherein the second line is arranged above the memory cell,
a film thickness of the first oxide film is thicker than a film thickness of the second oxide film, and
a film thickness of the second protective film is thicker than a film thickness of the protective film.

14. The non-volatile semiconductor storage device according to claim 13, wherein
the first oxide film exists on the side wall of the upper electrode layer and also exists on the side wall of the lower electrode layer.

15. The non-volatile semiconductor storage device according to claim 14, wherein
a width of the upper electrode layer in a direction perpendicular to a surface of the first oxide film is smaller than a width of the resistance change layer in a direction perpendicular to the surface of the first oxide film; and
a width of the lower electrode layer in a direction perpendicular to the surface of the first oxide film is smaller than a width of the resistance change layer in a direction perpendicular to the surface of the first oxide film.

16. The non-volatile semiconductor storage device according to claim 13, wherein
the diode layer is arranged below the lower electrode layer, and
the protective film further covers the side wall of the diode layer and the second oxide film.

17. The non-volatile semiconductor storage device according to claim 13, wherein
the diode layer is arranged above the upper electrode layer, and
the second protective film further covers the side wall of the diode layer and the second oxide film.

18. The non-volatile semiconductor storage device according to claim 13, further comprising
a second memory cell arranged above the memory cell through the second line, wherein
the second memory cell includes
a second resistance change layer,
a second upper electrode layer arranged above the second resistance change layer,
a second lower electrode layer arranged below the second resistance change layer,
a second diode layer arranged above the second upper electrode layer or below the second lower electrode layer, and
a third oxide film existing on a side wall of at least one electrode layer of the second upper electrode layer or the second lower electrode layer, a film thickness of the first oxide film is thicker than a film thickness of the second oxide film and a film thickness of the third oxide film, and the film thickness of the third oxide film is thicker than the film thickness of the second oxide film.

19. The non-volatile semiconductor storage device according to claim 18, wherein the diode layer is arranged above the upper electrode layer, and the second diode layer is arranged below the second lower electrode layer.

* * * * *